(12) United States Patent
Lee

(10) Patent No.: US 10,546,908 B2
(45) Date of Patent: Jan. 28, 2020

(54) ORGANIC LIGHT EMITTING DISPLAY DEVICE

(71) Applicant: LG Display Co., Ltd., Seoul (KR)

(72) Inventor: SeYong Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/842,610

(22) Filed: Dec. 14, 2017

(65) Prior Publication Data

US 2018/0175131 A1 Jun. 21, 2018

(30) Foreign Application Priority Data

Dec. 19, 2016 (KR) .................. 10-2016-0173945

(51) Int. Cl.
| | |
|---|---|
| *H01L 29/08* | (2006.01) |
| *H01L 27/32* | (2006.01) |
| *H01L 51/00* | (2006.01) |
| *H01L 51/52* | (2006.01) |
| *G09G 3/3266* | (2016.01) |
| *G09G 3/3275* | (2016.01) |
| *G09G 3/3233* | (2016.01) |

(52) U.S. Cl.
CPC ....... *H01L 27/3276* (2013.01); *G09G 3/3233* (2013.01); *G09G 3/3266* (2013.01); *G09G 3/3275* (2013.01); *G09G 2300/0426* (2013.01); *G09G 2380/02* (2013.01); *H01L 51/0097* (2013.01); *H01L 51/5253* (2013.01)

(58) Field of Classification Search
CPC ... H01L 27/32; H01L 27/3276; G09G 3/3233; G09G 3/3266; G09G 3/3275
See application file for complete search history.

(56) References Cited

U.S. PATENT DOCUMENTS

| | | | |
|---|---|---|---|
| 2007/0173927 A1* | 7/2007 | Shin | .................... A61F 2/90 623/1.18 |
| 2014/0183473 A1 | 7/2014 | Lee et al. | |
| 2014/0217373 A1 | 8/2014 | Youn et al. | |
| 2015/0342034 A1* | 11/2015 | Iwami | .................. H05K 1/0274 345/174 |
| 2017/0287936 A1* | 10/2017 | Kim | ...................... H01L 27/124 |

FOREIGN PATENT DOCUMENTS

| | | |
|---|---|---|
| KR | 10-2014-0085956 A | 7/2014 |
| KR | 10-2014-0099164 A | 8/2014 |

* cited by examiner

*Primary Examiner* — Phuc T Dang
(74) *Attorney, Agent, or Firm* — Polsinelli PC

(57) ABSTRACT

The organic light emitting display device according to the exemplary aspect of the present disclosure includes a flexible substrate which includes a first area, a second area, and a bending area between the first area and the second area, and a wiring line on the bending area of the flexible substrate. The wiring line has a plurality of unit patterns having a rhombic shape. In this case, each of plurality of unit patterns shares a part of one side with the adjacent unit pattern. According to the organic light emitting display device according to an exemplary aspect of the present disclosure, a wiring line having a new shape is disposed in the bending area so that a stress which is applied to the wiring line and the protective layer formed in the bending area may be minimized.

12 Claims, 9 Drawing Sheets

ORGANIC LIGHT EMITTING DISPLAY DEVICE

CROSS-REFERENCE TO RELATED APPLICATION

This application claims the priority of Korean Patent Application No. 10-2016-0173945 filed on Dec. 19, 2016, in the Korean Intellectual Property Office, the disclosure of which is incorporated herein by reference in its entirety.

BACKGROUND

Field of the Disclosure

The present disclosure relates to a display device, and more particularly, to an organic light emitting display device which can implement a narrow bezel or bezel free.

Description of the Background

A display device which implements various information through a screen is a core device of the information communication era and has been studied to be developed as a display device which becomes thinner, lighter, and portable and displays a high quality image. Display devices include an organic light emitting display device which is a self-emitting device, a plasma display device and a liquid crystal display which requires a separate light source. Since the organic light emitting display device is implemented without using a separate light source device, the organic light emitting display device can be implemented as a flexible display device. In this case, a flexible material such as plastic or metal foil is used for a substrate of the organic light emitting display device.

In the meantime, when the organic light emitting display device is implemented as a flexible display device, studies have been carried out to wrap or bend various parts of a display device using a flexible property. Such studies are carried out mainly for new designs and UI/UX and in some cases, the studies are carried out to reduce a size of a bezel of the display device.

As described above, when the substrate is bent in order to reduce a size of a bezel of the display device, a stress is intensively applied to a wiring line disposed in an area to be bent, the wiring line may be cracked. When the wiring line is cracked, the signals may not be normally transmitted so that a thin film transistor or an organic light emitting element is not normally operated, which results in malfunction of the light emitting display device.

SUMMARY

The present disclosure is to provide an organic light emitting display device which implements a narrow bezel or bezel free.

Further, the present disclosure is to provide an organic light emitting display device having a wiring line structure and a protective layer structure which can minimize a stress applied to the wiring line and the protective layer for protecting the wiring line formed in the bending area.

In addition, the present disclosure is to provide an organic light emitting display device which can minimize the damage of the wiring line due to disconnection or moisture permeation which is generated at the time of bending.

The present disclosure is not limited to the above-mentioned aspects, and other aspects, which are not mentioned above, can be clearly understood by those skilled in the art from the following descriptions.

According to an aspect of the present disclosure, there is provided an organic light emitting display device including a flexible substrate which includes a first area, a second area, a bending area between the first area and the second area, and a wiring line on the bending area of the flexible substrate. The wiring line has a plurality of unit patterns having a rhombic shape. In this case, each of plurality of unit patterns shares a part of one side with the adjacent unit pattern. In the organic light emitting display device according to the aspect of the present disclosure, a wiring line having a new shape is disposed in the bending area, so that a stress applied to the wiring line and the protective layer formed in the bending area may be minimized.

According to another aspect of the present disclosure, there is provided an organic light emitting display device including a flexible substrate which includes a display area in which an organic light emitting element is disposed, a first non-display area enclosing the display area, a bending area extending from the first non-display area, and a second non-display area extending from one side of the bending area. A wiring line is disposed in the bending area of the flexible substrate. In this case, one outer edge of the wiring line includes a first protruding portion and a second protruding portion which protrudes more than the first protruding portion and another outer edge of the wiring line includes a third protruding portion corresponding to the second protruding portion and a four protruding portion which protrudes more than the third protruding portion and corresponds to the first protruding portion. A plurality of openings is arranged in a zigzag in the wiring line.

According to another aspect of the present disclosure, there is provided an organic light emitting display device including a flexible substrate which includes a first area, a second area, a bending area between the first area and the second area, and a wiring line on the bending area of the flexible substrate. The wiring line includes a plurality of first wiring lines extending in a first direction and a plurality of second wiring lines which extends in a second direction and connects two adjacent first wiring lines among the plurality of first wiring lines. In this case, the plurality of second wiring lines is disposed to be spaced apart from each other along the first direction and a second wiring line which is connected to one side of the plurality of first wiring lines and a second wiring line which is connected to another side are alternately disposed.

According to another aspect of the present disclosure, there is provided an organic light emitting display device comprising a flexible substrate including a first area, a second area, and a bending area between the first area and the second area; and a wiring line on the bending area of the flexile substrate, including first, second and third unit patterns, and having a rhombic shape, wherein the first, second and third unit patterns share less than a full length of one side with adjacent unit patterns and form four joints spreading out external pressure when the organic light emitting display device is in a bending state.

Other detailed matters of the exemplary aspects are included in the detailed description and the drawings.

According to the present disclosure, a wiring line having a new structure is used so that a stress which is applied to the wiring line and the protective layer formed in the bending area may be minimized.

Further, according to the present disclosure, when the bending is performed, a phenomenon in that a crack is generated or moisture permeates through the wiring line due to the crack of the protective layer disposed on the wiring line may be suppressed.

By doing this, the present disclosure may provide an organic light emitting display device which implements a narrow bezel or bezel free.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
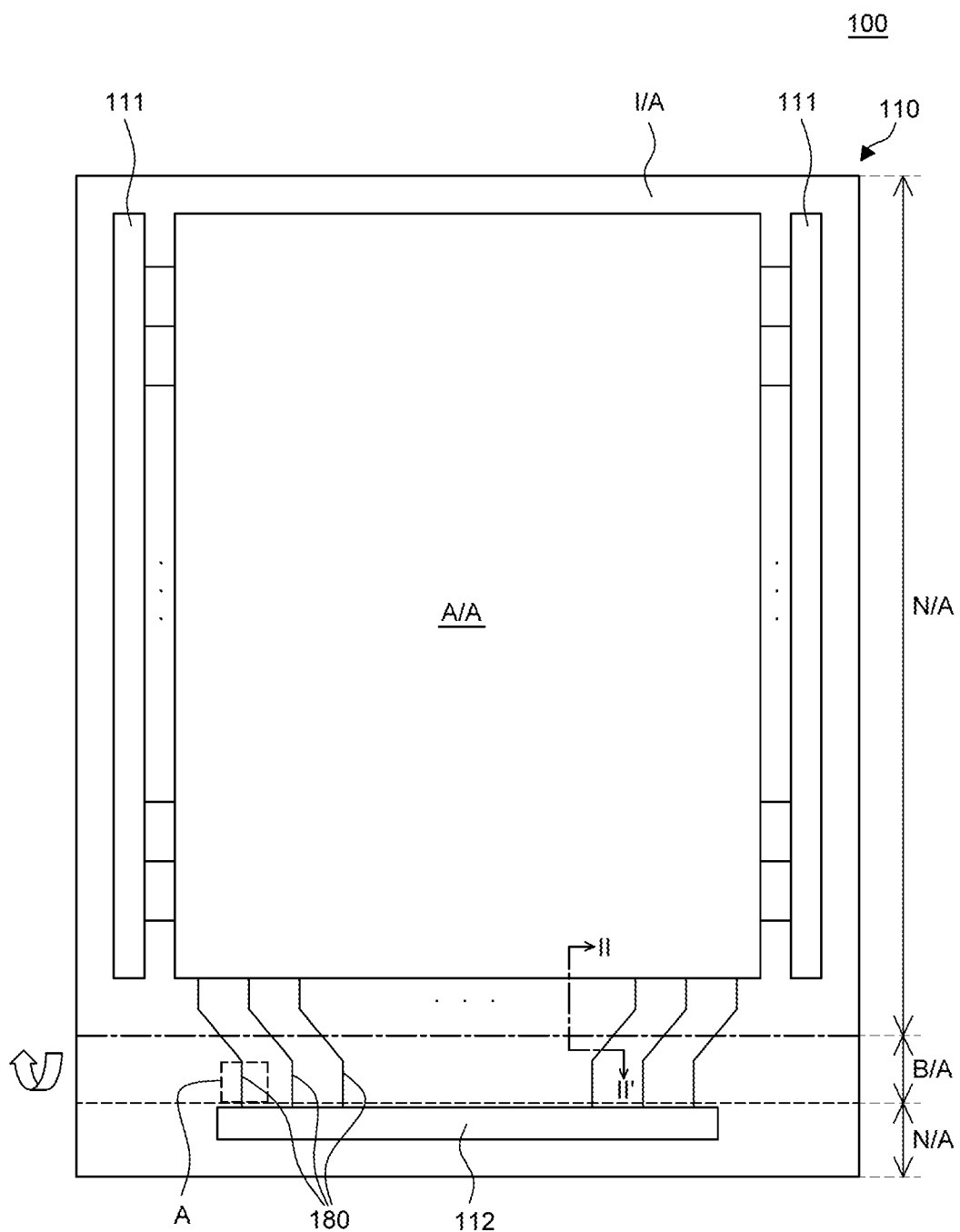
FIG. 1 is a schematic plan view illustrating an organic light emitting display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to exemplary aspect disclosed herein but will be implemented in various forms. The exemplary aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "consisting of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

In this specification, the flexible display device means a display device having a flexibility and is also used as the same meaning as a bendable display device, a rollable display device, an unbreakable display device, a foldable display device, a twistable display device, a stretchable display device, a wrinkable display device, and the like. In this specification, the flexible organic light emitting display device means an organic light emitting display device among various flexible display devices.

The features of various aspects of the present disclosure can be partially or entirely adhered to or combined with each other and can be interlocked and operated in technically various ways as understood by those skilled in the art, and the aspects can be carried out independently of or in association with each other.

Hereinafter, various exemplary aspects of the present disclosure will be described in detail with reference to accompanying drawings.

Figure 2:
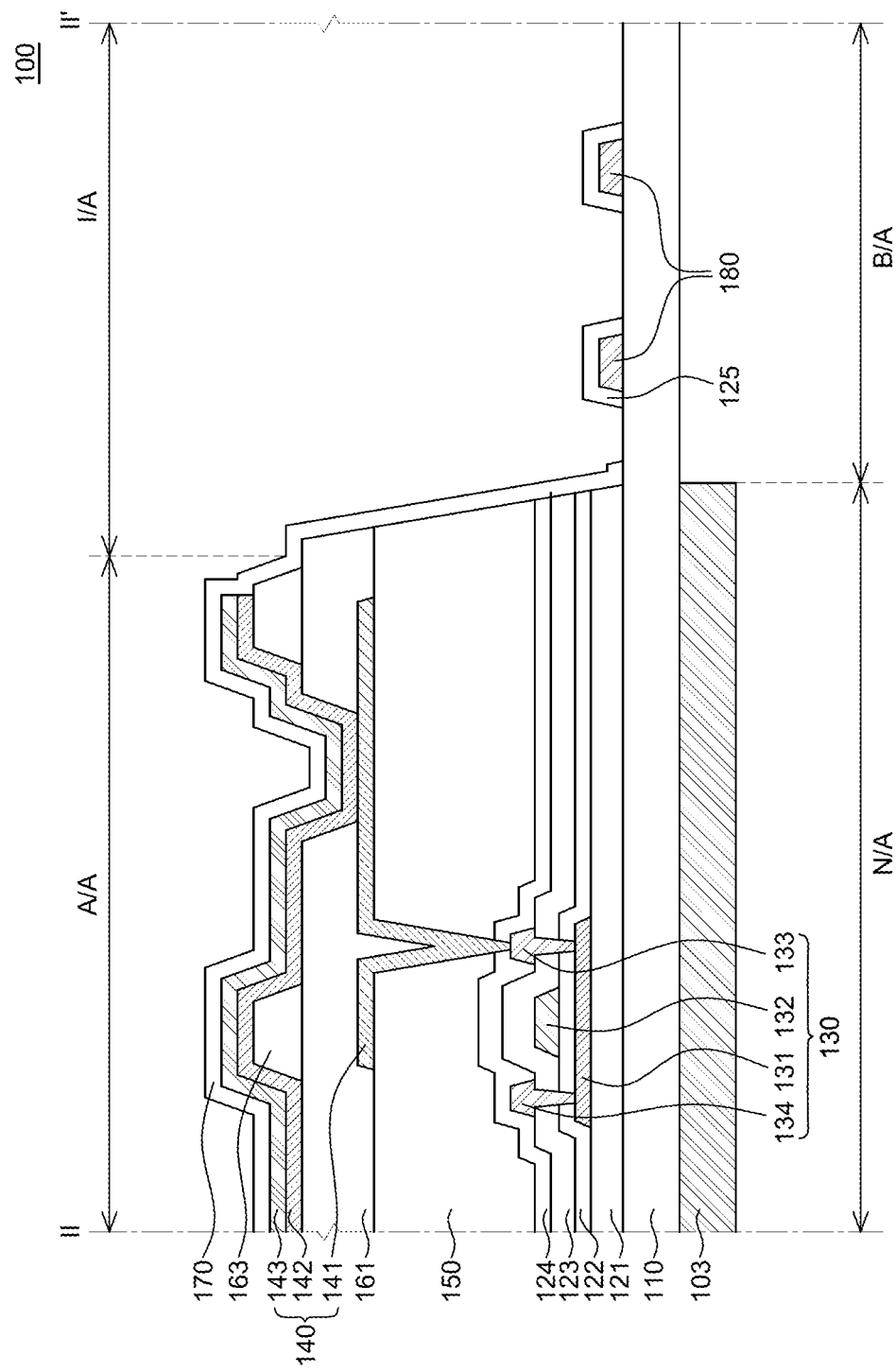
FIG. 2 is a cross-sectional view taken along the line II-II' of FIG. 1.

FIG. 1 is a schematic plan view illustrating an organic light emitting display device according to an exemplary aspect of the present disclosure. FIG. 2 is a cross-sectional view taken along the line II-II' of FIG. 1. Referring to FIGS. 1 and 2, an organic light emitting display device 100 includes a supporting substrate 103, a flexible substrate 110, a pad unit 112, a thin film transistor 130, an organic light emitting element 140, an encapsulation layer 170, a wiring line 180, and a protective layer 125. In FIG. 1, the supporting substrate 103 is omitted and a specific shape of the thin film transistor 130 and the organic light emitting element 140 disposed on the flexible substrate 110 is omitted.

The flexible substrate 110 is a substrate which supports several components of the organic light emitting display device 100. The flexible substrate 110 may be bent. For example, the flexible substrate 110 may be bent in a horizontal direction, a vertical direction, or a diagonal direction. Therefore, the flexible substrate 110 may be bent in a combination of the vertical, horizontal, and diagonal directions, based on a design required for the organic light emitting display device 100.

The flexible substrate 110 may be formed of a material having flexibility so as to be bent. For example, the flexible substrate 110 may be implemented by a thin plastic film formed of a polymer such as polyimide, polyethylene naphthalate (PEN), and polyethylene terephthalate (PET).

The flexible substrate 110 includes at least one active area A/A. The active area A/A is an area where the organic light emitting element 140 is disposed. The display area means an area where an image is displayed and is referred to as a display area. At least one inactive area I/A may be disposed around the active area A/A. That is, the inactive area I/A may be adjacent to one or more sides of the active area A/A. For example, as illustrated in FIG. 1, the non-active area I/A encloses a quadrangular active area A/A. However, a shape of the active area A/A and a shape and an arrangement of the inactive area I/A which is in contact with the active area A/A are not limited to the example illustrated in FIG. 1. The active area A/A and the inactive area I/A may have various shapes appropriate for a design of an electronic apparatus in which the organic light emitting display device 100 is mounted. For example, the active area may be formed in the form of a pentagon, a hexagon, a circle, or an ellipse.

The flexible substrate 110 includes a first area, a bending area B/A extending from one side of the first area, and a second area extending from one side of the bending area B/A. The first area may be defined as a non-bending area N/A including the active area A/A and the second area may be defined as a non-bending area which is disposed in an opposite side to the first area with respect to the bending area B/A.

A part of the flexible substrate 110 may be bent. For example, as illustrated in FIG. 1, a lower end of the active area A/A may be bent. That is, the bending area B/A of the flexible substrate 110 is bent.

Even though it is illustrated that the non-active area I/A of the flexible substrate 110 is bent in FIG. 1, a part of the active area A/A of the flexible substrate 110 may be bent. In this case, an image may be displayed in an area of the active area A/A which is bent and the organic light emitting display device 100 may substantially include a flat display area and a bent display area.

The pad unit 112 is disposed in the inactive area I/A of the second area of the flexible substrate 110. For example, as illustrated in FIG. 1, the pad unit 112 is disposed in the inactive area I/A which is in contact with the active area A/A at the lower end of the flexible substrate 110. The pad unit 112 is connected to a circuit film such as an FPCB and also functions as a contact terminal which connects the circuit film and the wiring line 180 to each other.

In the active area A/A, the thin film transistor 130 which is connected to the organic light emitting element 140 is disposed. The thin film transistor 130 operates in association with the driving unit 111 located in the inactive area I/A and controls a driving current amount which is supplied to the organic light emitting element 140.

The driving unit 111 is disposed in the inactive area I/A of the flexible substrate 110 and supplies a driving signal to the thin film transistor 130. For example, the driving unit 111 may be a gate driving unit which supplies a gate signal to the thin film transistor 130. The gate driving unit includes various gate driving circuits and the gate driving circuits may be formed directly on the flexible substrate 110. In this case, the driving unit 111 may be referred to as a gate-in-panel (GIP).

Even though not illustrated in FIG. 1, a data driving unit which supplies a data signal to the thin film transistor 130 is mounted on a separated printed circuit board (PCB) to be connected to the flexible substrate 110 through a circuit film such as a flexible printed circuit board (FPCB). The data driving unit may be disposed directly in the pad unit 112 of the flexible substrate 110 by a chip-on-film (COF) manner.

In some exemplary aspects, various additional elements for generating various signals or driving the organic light emitting element 140 in the active area A/A may be provided on the flexible substrate 110. For example, an inverter circuit, a multiplexer, an electro static discharging circuit, and the like may be disposed on the flexible substrate 110.

As illustrated in FIG. 2, in order to increase strength and/or rigidity in a specific part of the flexible substrate 110, one or more supporting substrates 103 are disposed below the flexible substrate 110. For example, the supporting substrate 103 is disposed only in the non-bending area N/A. In this case, the supporting substrate 103 is not disposed in a bending area B/A for which a flexibility for bending is required. That is, the supporting substrate 103 is disposed in a partial area of the active area A/A in which the organic light emitting element 140 is disposed and a partial area of the inactive area I/A in which the pad unit 112 is disposed, but is not disposed in the bending area B/A. The supporting substrate 103 supports the flexible substrate 110 such that the flexible substrate 110 is not rolled during a process of forming components, such as the thin film transistor 130, the organic light emitting element 140, or the pad unit 112, on the flexible substrate 110.

The supporting substrate 103 may be formed of a thin plastic film such as polyimide, polyethylene naphthalate, polyethylene terephthalate, and a combination of other appropriate polymers. Further, the supporting substrate 103 may be implemented by a thin glass, a metal foil shielded by a dielectric substance, or a polymer film in which a polymer material combined with a multilayered polymer, nano particles, or micro particles is included.

A buffer layer 121 is disposed on the flexible substrate 110. The buffer layer 121 may suppress moisture or impurities from permeating through the flexible substrate 110 and planarize an upper portion of the flexible substrate 110. The buffer layer 121 may be formed of a multilayered structure in which silicon nitride ($SiN_x$) and silicon oxide ($SiO_2$) are alternately laminated. However, the buffer layer 121 may not be an essential component and whether to form the buffer layer 121 may be determined depending on a type of the flexible substrate 110 or a type of the thin film transistor 130.

The thin film transistor 130 is formed on the buffer layer 121. The thin film transistor 130 includes an active layer 131, a gate electrode 132, a source electrode 133, and a drain electrode 134. Specifically, the active layer 131 is formed on the buffer layer 121 and a gate insulating layer 122 which insulates the active layer 131 from the gate electrode 132 is formed on the active layer 131. Further, the gate electrode 132 is formed on the gate insulating layer 122 to overlap the active layer 131 and an interlayer insulating layer 123 is formed on the gate electrode 132 and the gate insulating layer 122. The source electrode 133 and the drain electrode 134 are formed on the interlayer insulating layer 123. The source electrode 133 and the drain electrode 134 are electrically connected to the active layer 131. For the convenience of description, in FIG. 2, only a driving thin film transistor is illustrated among various thin film transistors which may be included in the organic light emitting display device 100. However, a switching thin film transistor or a capacitor may also be included in the organic light emitting display device 100. Further, even though in the present disclosure, it is described that the thin film transistor 130 has a coplanar structure, a staggered thin film transistor 130 may also be used.

The active layer 131 may be formed of amorphous silicon (a-Si), polycrystalline silicon (poly-Si), an oxide semiconductor, or an organic semiconductor. When the active layer 131 is formed of the oxide semiconductor, the active layer 131 may be formed of ITO, IZO, indium gallium zinc oxide (IGZO), or indium tin zinc oxide (ITZO), but is not limited thereto.

The gate insulating layer 122 and the interlayer insulating layer 123 are disposed on the buffer layer 121 and are formed of an inorganic insulating material such as silicon nitride or silicon oxide. The gate insulating layer 122 and the interlayer insulating layer 123 may be formed of a single layered structure or a multi-layered structure formed of an inorganic insulating material.

A passivation layer 124 is disposed so as to cover the thin film transistor 130. The passivation layer 124 may be formed of the same inorganic insulating material as the gate insulating layer 122 or the interlayer insulating layer 123 and protects the source electrode 134 and the drain electrode 133 of the thin film transistor 130.

A planarization layer 150 is disposed on the passivation layer 124. The planarization layer 150 is a layer which planarizes an upper portion of the flexible substrate 110 and may be formed of an organic insulating material so as to cover a step of the upper portion of the flexible substrate 110. For example, the planarization layer 150 may be formed of at least one material of acrylates resin (polyacrylates resin), epoxy resin, phenolic resin, polyamides resin, polyimides rein, unsaturated polyesters resin, polyphenylenethers resin, polyphenylenesulfides resin, and benzocyclobutene, but is not limited thereto. The planarization layer 150 may be formed of a single layer, double layers or multiple layers. The planarization layer 150 includes a contact hole which electrically connects the thin film transistor 130 to the anode 141.

The organic light emitting element 140 is disposed on the planarization layer 150 and includes an anode 141, an organic layer 142, and a cathode 143. The anode 141 is an electrode which supplies holes to the organic layer 142 and is connected to the thin film transistor 130. The anode 141 may be formed of a transparent conductive material having a high work function in order to supply holes to the organic layer 142. The transparent conductive material may include ITO, IZO, or ITZO, but is not limited thereto. As illustrated in FIG. 2, when the organic light emitting display device 100 is driven by a top emission method, the anode 141 may further include a reflector.

The cathode 143 is an electrode which supplies electrons to the organic layer 142. The cathode 143 may be formed of a metal having a relatively low work function, for example, silver, titanium (Ti), aluminum, molybdenum (Mo), or an alloy (Ag:Mg) of silver and magnesium. As illustrated in FIG. 2, when the organic light emitting display device 100 is driven by a top emission method, a metal layer which constitutes the cathode 143 may have a very thin thickness so that the light passes therethrough. In some exemplary aspects, the cathode 143 may be formed of a transparent conductive material such as ITO, IZO, and ITZO.

The organic layer 142 is disposed between the anode 141 and the cathode 143. The organic layer 142 includes an organic light emitting layer. The organic light emitting layer emits light having a specific wavelength and may emit red light, green light, or blue light. In some exemplary aspects, the organic light emitting layer may be configured by a multilayered structure in which a red light emitting layer emitting red light, a green light emitting layer emitting green light, and a blue light emitting layer emitting blue light are laminated to emit white light.

In addition to the organic light emitting layer, the organic layer 142 may further include organic layers, such as an injecting layer or a transporting layer, which improve an emission efficiency of the organic light emitting element 140. For example, in addition to the organic light emitting layer, a hole injection layer or a hole transport layer may be further disposed between the anode 141 and the cathode 143 in order to allow the holes to smoothly move.

A bank layer 161 is disposed on the planarization layer 150 and covers an edge of the anode 141. The bank layer 161 defines an emission area where the organic light emitting element 140 emits light. That is, the bank layer 161 is disposed to enclose the edge of the anode 141 and includes an opening which defines the emission area. The anode 141, the organic layer 142, and the cathode 143 may be sequentially laminated in an area corresponding to the opening of the bank layer 161. Since the organic light emitting layer of the organic layer 143 emits light based on the holes supplied from the anode 141 and the electrons supplied from the cathode 143, the organic light emitting element 140 may emit light in an area corresponding to the opening of the bank layer 161. The bank layer 161 is formed of an insulating material to insulate the anodes 131 of the adjacent sub pixels from each other. For example, the bank layer 161 may be formed of one or more materials of polyimide resin, polyacrylic resin, and polystyrene resin, but is not limited thereto. According to some exemplary aspects, the bank layer 161 may be configured by a black bank having a high light absorption rate to avoid color mixture of light which is generated in the emission area.

A spacer 163 is disposed on the bank layer 161. The spacer 163 is disposed to enclosure the opening of the bank layer 161 to protect the organic layer 142 in the opening of the bank layer 161 from an external pressure. The spacer 163 may be formed of the same resin composition as the bank layer 161 and may be configured by a black spacer having a high light absorption rate to avoid color mixture of the light. In some exemplary aspects, the bank layer 161 and the spacer 163 may be one structure which is configured by the same material. In this case, the bank layer 161 and the spacer 163 may be formed by a patterning process using a halftone mask.

An encapsulation layer 170 is disposed on the organic light emitting element 140 to protect the organic light emitting element 140. The encapsulation layer 170 blocks permeation of oxygen and moisture from the outside. When the organic light emitting element 140 is exposed to the moisture or oxygen, a pixel shrinkage phenomenon in which the emission area is reduced may be generated or a dark spot may be generated in the emission area. The encapsulation layer 170 may be formed of a multilayered structure in which an inorganic encapsulation layer and an organic encapsulation layer are alternately laminated to minimize moisture or oxygen inflowing from the outside. For example, the encapsulation layer 170 may include a first inorganic encapsulation layer, an organic encapsulation layer, and a second inorganic encapsulation layer.

For example, the first inorganic encapsulation layer 171 and the second inorganic encapsulation layer 172 may be formed of an inorganic insulating material, such as silicon nitride, silicon oxide, or aluminum oxide $Al_2O_3$, which has a low water vapor transmission rate (WVTR) to protect the organic light emitting element 140 from the moisture. Further, the organic encapsulation layer which is disposed between the first inorganic encapsulation layer and the second inorganic encapsulation layer covers a step and foreign substances of a lower portion to planarize an upper surface of the flexible substrate 110.

A wiring line 180 is formed on the flexible substrate 110. The wiring line 180 extends from the active area A/A to the inactive area I/A to be connected to the pad unit 112. The wiring line 180 transmits various electric signals which are transmitted through the pad unit 112 to the driving circuit such as the thin film transistor 130 disposed in the active area A/A.

A part of the wiring line 180 which extends to the pad unit 112 disposed in the inactive area I/A in a lower end of the active area A/A is illustrated in FIG. 2. As mentioned above, the inactive area I/A to which the wiring line 180 extends may be bent. Therefore, the wiring line 180 may extend from the non-bending area N/A where the flexible substrate 110 is not bent to the bending area B/A.

The wiring line 180 may be formed of metal having excellent conductivity. For example, the wiring line 180 may be formed of the same metal as the source electrode 133 or the drain electrode 134 of the thin film transistor 130. However, the wiring line 180 is not limited thereto and may be formed of the same metal as the gate electrode 132 of the thin film transistor 130.

Differently from the wiring lines disposed in the non-display area N/A, the wiring lines 180 disposed in the bending area B/A are applied with a stress due to the bending of the flexible substrate 110. Therefore, the wiring lines disposed in the bending area need to be designed to be strong against the stress and have a low resistance. Further, the wiring lines need to have sufficient flexibility to easily bend the flexible substrate 110. For example, the wiring lines 180 may have a structure having a plurality of unit patterns having a rhombic shape. In this case, each of the plurality of unit patterns may share a part of one side with an adjacent unit pattern. A specific shape of the wiring lines 180 will be described below with reference to FIGS. 3A and 3B.

In the meantime, the wiring lines 180 may be formed of a single metal layer structure or formed of a multilayered structure in which a plurality of metal layers is laminated. Specifically, the wiring lines 180 may be formed of two or more layers selected from aluminum (Al), titanium (Ti), molybdenum (Mo), and copper (Cu) layers. An example of the combination includes a structure (Ti/Al/Ti) in which an aluminum layer is disposed between titanium layers, a structure (Mo/Al/Mo) in which an aluminum layer is disposed between molybdenum layers, a structure (Ti/Cu/Ti) in which a copper layer is disposed between titanium layers, and a structure (Mo/Cu/Mo) in which a copper layer is disposed between molybdenum layers. The wiring lines 180 having the above-described multilayered structure may have excellent conductivity due to a low contact resistance between the metal layers while maintaining a sufficient flexibility.

The protective layer 125 is formed on the wiring lines 180 to suppress corrosion or damage of the wiring lines 180. The protective layer 125 is formed to be in direct contact with all surfaces of the wiring line 180 excluding a surface which is in contact with the flexible substrate 110 to protect the wiring lines 180 from moisture or air which may penetrate from the outside. In this case, when the protective layer 125 is seen from the top, the protective layer 125 may have substantially the same shape as the wiring lines 180.

In this case, the protective layer 125 may be the same layer as the passivation layer 124 which covers the thin film transistor 130 in the non-bending area N/A. As illustrated in FIG. 2, the protective layer 125 may be patterned to have the same shape as the shape of the wiring lines 180, but is not limited thereto. When the protective layer 125 in the bending area B/A is patterned to have the same shape as the shape of the wiring line 180, the lowering of the flexibility of the flexible substrate 110 due to the protective layer 125 may be minimized. Further, a problem in that the protective layer 125 is cracked due to the stress caused by the bending of the flexible substrate 110 may be minimized.

Figure 3A:
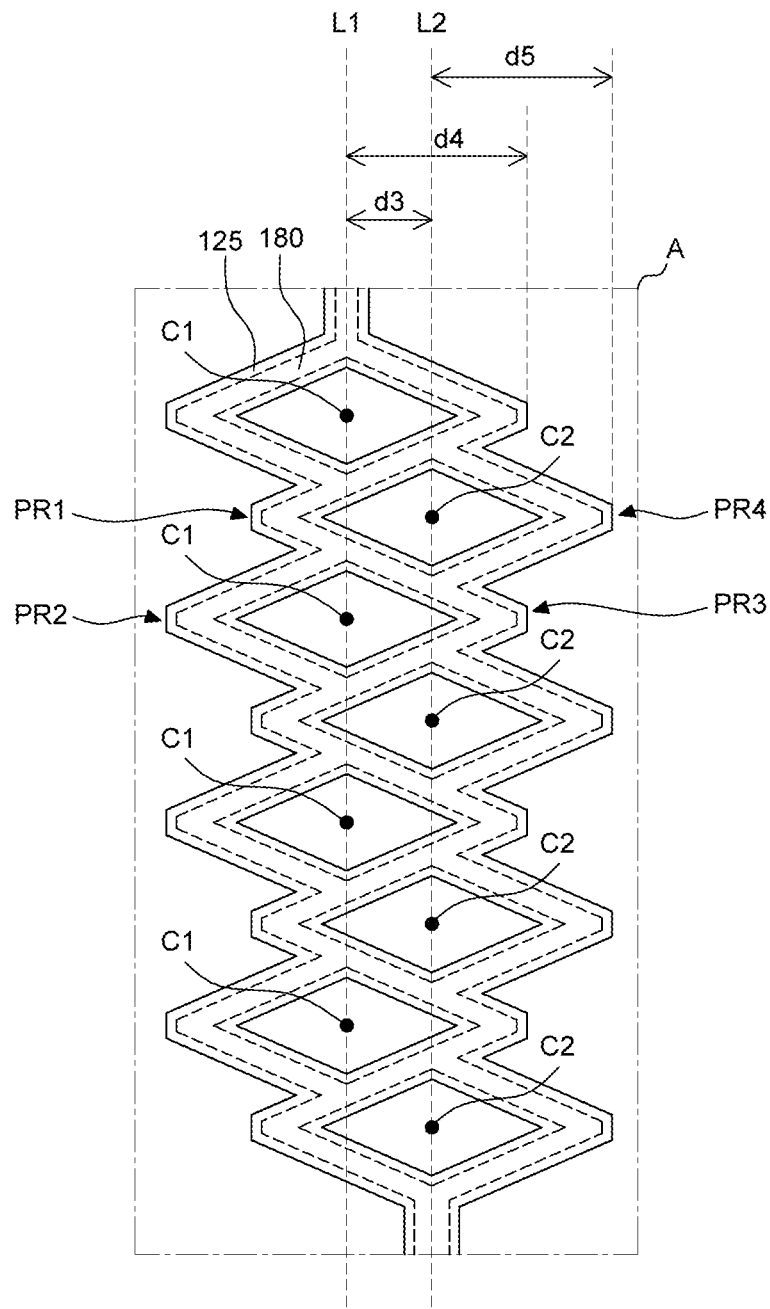
FIGS. 3A and 3B are plan views for explaining a shape of a wiring line of an organic light emitting display device according to an exemplary aspect of the present disclosure.
Figure 3B:
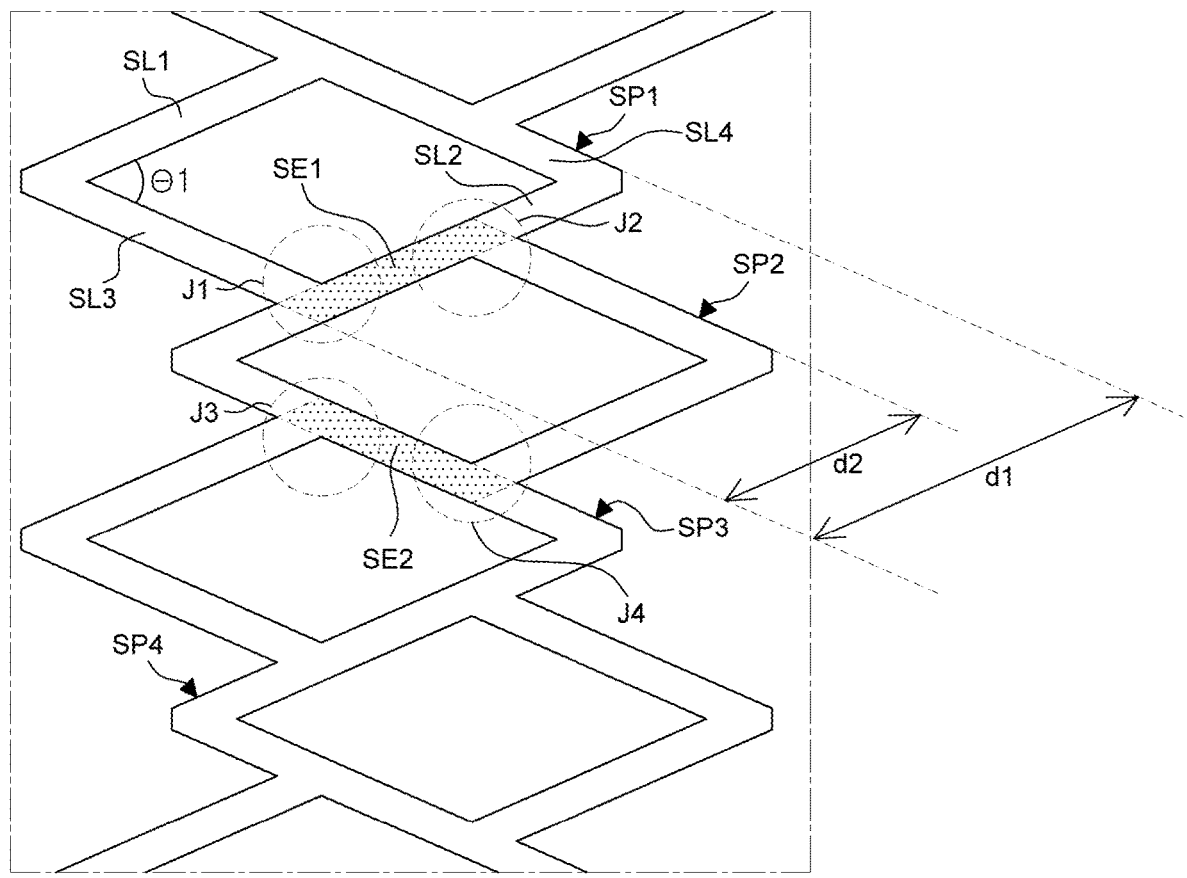

FIGS. 3A and 3B are plan views for explaining a shape of a wiring line of an organic light emitting display device according to an exemplary aspect of the present disclosure. Specifically, FIG. 3A is a schematic enlarged plan view of an area A of FIG. 1. In FIG. 3A, the wiring line 180 is represented by a dotted line and the protective layer 125 which is disposed on the wiring line 180 is represented by a solid line. FIG. 3B is a plan view illustrating only the wiring line 180 with a solid line by enlarging a partial area of FIG. 3A.

As mentioned above, differently from the wiring lines disposed in the non-bending area N/A, the wiring lines 180 disposed in the bending area B/A are applied with a stress due to the bending of the flexible substrate 110. Therefore, the wiring lines disposed in the bending area need to have a shape and a structure strong against the stress. Further, components disposed on the bending area B/A need to have excellent flexibility so as to easily bend the flexible substrate 110 in the bending area B/A.

Referring to FIGS. 3A and 3B, the wiring line 180 includes a plurality of unit patterns SP1, SP2, SP3, and SP4 having a rhombic shape. More specifically, referring to FIG. 3B, each of the unit patterns SP1, SP2, SP3, and SP4 includes a first sub wiring line SL1, a second sub wiring line SL2, a third sub wiring line SL3, and a fourth sub wiring line SL4. The second sub wiring line SL2 faces the first sub wiring line SL1 and is parallel to the first sub wiring line SL1. The third sub wiring line SL3 forms an acute angle $\theta 1$ with the first sub wiring line SL1 and forms an obtuse angle with the second sub wiring line SL2. The fourth sub wiring line SL4 faces the third sub wiring line SL3 and is parallel to the third sub wiring line SL3. In each unit pattern SP1, SP2, SP3, and SP4, the first sub wiring line SL1, the second sub wiring line SL2, the third sub wiring line SL3, and the fourth sub wiring line SL4 are connected to have a rhombic shape, that is, a diamond shape pattern structure.

In this case, each of the unit patterns SP1, SP2, SP3, and SP4 shares a part of one sub wiring line with an adjacent unit pattern. Specifically, referring to FIG. 3B, the second sub wiring line SL2 of the first unit pattern SP1 and the first sub wiring line SL1 of the second unit pattern SP2 are partially shared. Here, "partially sharing" means that one sub wiring line of one unit pattern having a rhombic shape is formed to partially overlap one sub wiring line of an adjacent unit pattern. Here, a length d2 of the wiring line shared between the adjacent unit patterns is smaller than a length d1 of the sub wiring line of one unit pattern.

For example, referring to FIG. 3B, the first sub wiring line SL1 of the second unit pattern SP2 is formed to overlap the second sub wiring line SL2 of the first unit pattern SP1 to form a first intersecting line SE1. Further, the third sub wiring line SL3 of the second unit pattern SP2 is formed to overlap the fourth sub wiring line SL4 of the third unit pattern SP3 to form a second intersecting line SE2. In this case, a length d2 of the first intersecting line SE1 is smaller than a length of the first sub wiring line SL1 of the second unit pattern SP2.

As described above, each unit pattern is configured to share a part of one side with the adjacent unit pattern so that four joints are formed in one unit pattern. Specifically, referring to FIG. 3B, the second unit pattern SP2 includes a first joint J1, a second joint J2, a third joint J3, and a fourth joint J4. The first joint J1 is a joint where the first sub wiring line SL1 of the second unit pattern SP2 meets the third sub wiring line SL3 of the first unit pattern SP1. The second joint J2 is a joint where the fourth sub wiring line SL4 of the second unit pattern SP2 meets the second sub wiring line SL2 of the first unit pattern SP1. The third joint J3 is a joint where the third sub wiring line SL3 of the second unit pattern SP2 meets the first sub wiring line SL1 of the third unit pattern SP3. The fourth joint J4 is a joint where the second sub wiring line SL2 of the second unit pattern SP2 meets the fourth sub wiring line SL4 of the third unit pattern SP3. In this case, each joint J1, J2, J3, and J4 has a structure in which sub wiring lines extending in three directions intersect each other.

In the meantime, referring to FIG. 3A, the wiring line includes a first pattern and a second pattern in which a plurality of unit patterns is disposed to be spaced apart from each other along a bending direction. In this case, a first line L1 which passes center points C1 of the unit patterns of the first pattern is spaced apart from a second line L2 which passes center points C2 of the unit patterns of the second pattern. That is, the first pattern is a set of a plurality of unit patterns which is spaced apart from each other in the bending direction and the second pattern is a set of a plurality of unit patterns which is spaced apart from each other in the bending direction. Referring to FIG. 3B, the first pattern includes the first unit pattern SP1 and the third unit pattern SP3 and the second pattern includes the second unit pattern SP2 and the fourth unit pattern SP4.

Each of the first pattern and the second pattern includes a plurality of openings by a plurality of unit patterns. By doing this, a plurality of openings is arranged in the wiring line in a zigzag fashion.

In this case, a spaced distance d3 between the first line L1 and the second line L2 is smaller than a spaced distance d4 between the outermost edge of the unit patterns of the first pattern and the first line L1 and is smaller than a spaced distance d5 between the outermost edge of the unit patterns of the second pattern and the second line L2.

In the meantime, the wiring line 180 includes a first protruding portion PR1 and a second protruding portion PR2 which are repeatedly disposed to one outer edge and a third protruding portion PR3 and a fourth protruding portion PR4 which are repeatedly disposed to another outer edge. In this case, the second protruding portion PR2 protrudes more than the first protruding portion PR1. Further, the third protruding portion PR3 corresponds to the second protruding portion PR2 and the fourth protruding portion PR4 corresponds to the first protruding portion PR1. In this case, the fourth protruding portion PR4 protrudes more than the third protruding portion PR3.

Referring to FIG. 3A, the first protruding portion PR1 is an area protruding to a left outer edge of the unit patterns of the second pattern and the second protruding portion PR2 is an area protruding to a left outer edge of the unit patterns of the first pattern. Similarly, the third protruding portion PR3 is an area protruding to a right outer edge of the unit patterns of the first pattern and the fourth protruding portion PR4 is an area protruding to a right outer edge of the unit patterns of the second pattern.

As described above, the wiring line 180 has a plurality of openings having a rhombic shape. By doing this, the wiring line includes a plurality of repeated protruding portions PR1, PR2, PR3, and PR4 and includes an opening formed in a zigzag in the wiring line 180. In this case, the first protruding portion PR1 and the third protruding portion PR3 are connected to each other so that the wiring line 180 forms an opening having a rhombic shape. In this case, a connecting wiring line which connects the first protruding portion PR1 and the third protruding portion PR3 may be a side which is shared by the unit patterns, as illustrated in FIG. 3B.

In the meantime, referring to FIG. 3A, the protective layer 125 which covers the wiring line 180 is formed with a predetermined margin from an outer corner of the wiring line 180. Excluding the protective layer 125 which covers the wiring line 180 with a predetermined margin, the protective layer is not formed in other area. That is, the protective layer 125 is formed to have a shape corresponding to a shape of the wiring line 180. Therefore, a width of the protective layer 125 is larger than a width of the wiring line 180.

In the organic light emitting display device 100 according to an exemplary aspect of the present disclosure, the wiring line 180 may be used as a gate wiring line or a data wiring line.

The organic light emitting display device 100 according to the exemplary aspect of the present disclosure uses a wiring line having a new shape, so that a stress which is applied to the wiring line and the protective layer formed in the bending area is minimized.

Specifically, when the bending area B/A of the flexible substrate 110 is bent, the wiring line 180 formed in the bending area B/A is applied with a stress in the bending direction. Specifically, a wiring line formed in a direction parallel to the bending direction of the bending area B/A is applied with a stress which is larger than that of a wiring line formed in a direction which is different from the bending direction. Therefore, the wiring line formed in a direction parallel to the bending direction is highly likely to be cracked as compared with the wiring line formed in a direction which is different from the bending direction. In the organic light emitting display device 100 according to the exemplary aspect of the present disclosure, the wiring line 180 has a plurality of unit patterns having a rhombic shape and each of the sub wiring lines which form the rhombic shape is disposed in a direction different from the bending direction. Therefore, as compared with a case when the wiring line is formed to be parallel to the bending direction of the bending area, a wiring line of a unit pattern having a rhombic shape may reduce the stress.

In the meantime, the wiring line 180 of the organic light emitting display device 100 according to an exemplary aspect of the present disclosure may reduce a stress which is applied to the wiring line 180 as compared with a wiring line having a general mesh pattern. More specific description will be provided with reference to FIG. 4.

Figure 4:
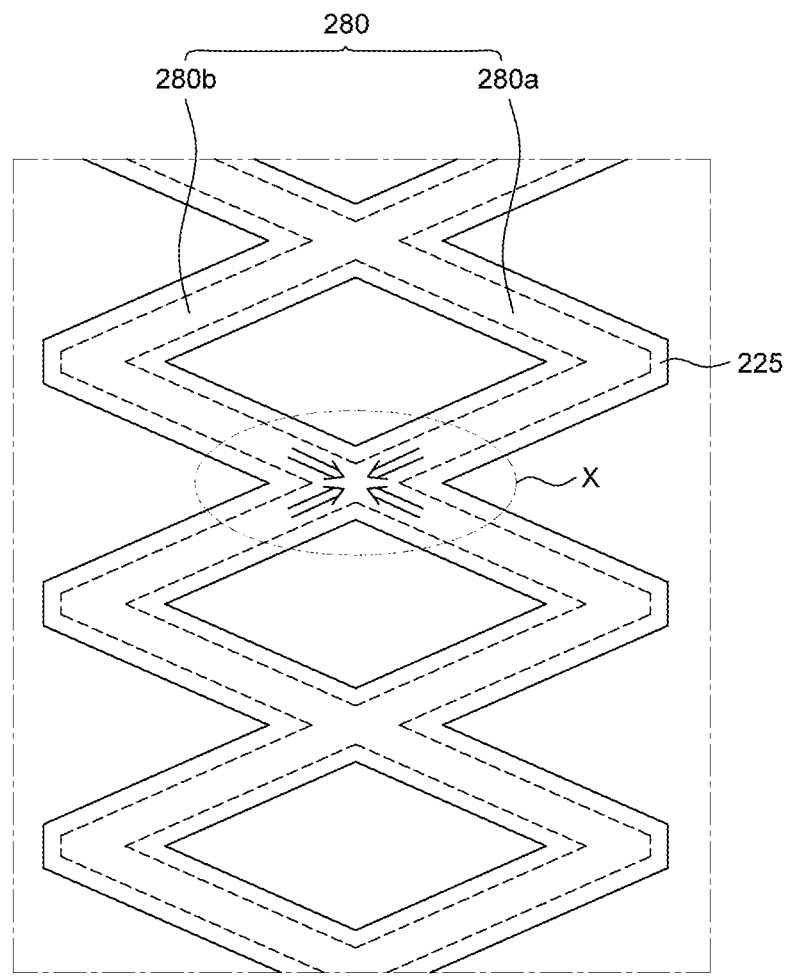
FIG. 4 is a schematic enlarged plan view of a wiring line of an organic light emitting display device according to Comparative Example.

FIG. 4 is an enlarged schematic plan view of a wiring line of an organic light emitting display device according to Comparative Example. FIG. 4 illustrates a structure of a wiring line 280 having a general mesh pattern and a protective layer 225.

Referring to FIG. 4, the general mesh pattern has a structure in which a plurality of rhombic patterns is formed in parallel along the bending direction. The wiring line 280 illustrated in FIG. 4 has a structure in which vertices of the plurality of rhombic patterns are connected. More specifically, the wiring line 280 illustrated in FIG. 4 branches at one point to include a first sub wiring line extending to a first direction which is different from the bending direction and a second sub wiring line extending to a second direction which is different from the first direction. In this case, the first sub wiring line and the second sub wiring line are bent and gathered at another point to form a rhombic shape. As compared with the wiring line 180 disposed in the organic light emitting display device 100 according to the exemplary aspect of the present disclosure illustrated in FIGS. 3A and 3B, differently from the wiring line 180 illustrated in FIGS. 3A and 3B in which four joints are formed in one repeated pattern having a rhombic shape, the wiring line 180 illustrated in FIG. 4 has two joints X in one single pattern. In this case, each joint X is a point at which wiring lines extending in four directions intersect each other.

Specifically, the wiring lines 280 in four directions illustrated in FIG. 4 intersect at one joint X. In such a structure, when the bending area B/A of the flexible substrate is bent, the stress is intensively applied to one joint X from the wiring lines in four directions. In contrast, in the wiring line 180 illustrated in FIG. 3B, the joints J1, J2, J3, and J4 are intersection points of wiring lines extending in three directions. Therefore, the stress is concentrated to individual joints J1, J2, J3, and J4 from the wiring lines in three directions. Therefore, when the bending area B/A is bent, a pressure which is applied to the joints J1, J2, J3, and J4 of the wiring line 180 illustrated in FIG. 3B is lower than a pressure which is applied to the joint X of the wiring line 280 illustrated in FIG. 4. Therefore, a possibility of crack at the joint of the wiring line is lowered. Therefore, in the organic light emitting display device 100 according to the exemplary aspect of the present disclosure, a failure which may be caused by the cracked wiring line 180 may be minimized.

Further, similar to the wiring line 180, the protective layer 125 which encloses the wiring line 180 may also minimize a stress which is applied to the protective layer 125 due to the structural characteristic. Therefore, the crack which is generated in the protective layer 125 when the flexible substrate 110 is bent is suppressed so that a phenomenon in which moisture permeates the wiring line 180 when the protective layer 125 is cracked may be suppressed.

Hereinafter, an effect that the stress applied to the wiring line disposed in the bending area of the organic light emitting display device 100 according to the exemplary aspect of the present disclosure is reduced will be described in detail using Examples. However, the following Examples are set forth to illustrate the present disclosure, but the scope of the present disclosure is not limited thereto.

Example 1 of the present disclosure is a wiring line structure illustrated in FIGS. 3A and 3B and Comparative Example 1 is a wiring line structure illustrated in FIG. 4. In order to identify a stress which is applied to each wiring line and protective layer when wiring line structures of Example 1 and Comparative Example 1 are bent, a degree of a stress which is applied to the wiring line and the protective layer when a flexible substrate on which the wiring line and the protective layer are disposed is bent with a radius of curvature of 0.33R is schematically illustrated using an engineering simulation program ANSYS. In this case, it is assumed that the flexible substrate, the wiring line, and the protective layer which configure the wiring line structure of Example 1 and Comparative Example 1 are formed of the same material and have the same physical property. Specifically, a Young's modulus and a Poisson's ratio of the substrate are set to be 26.273 GPa and 0.34, respectively and a Young's modulus and a Poisson's ratio of the wiring line are set to be 154.0 GPa and 0.25, respectively. Further, a Young's modulus and a Poisson's ratio of the protective layer are set to be 0.71 Pa and 0.33, respectively. Further, in the rhombic unit pattern which configures the wiring line in the wiring line structure illustrated in Examples 1 and 2, a length of a sub wiring line which configures a corner is 24 µm, a width of the sub wiring line is 3.7 µm, and an acute angle formed by the sub wiring lines is 33°. A thickness of the wiring line is 5000 Å. Further, in the protective layer which covers the wiring line, a width of an area extending from an outer corner of the wiring line is 1.5 µm and a thickness of the protective layer is 2000 Å. A simulation result which shows a stress of the wiring line structure of Example 1 and Comparative Example 1 is illustrated in FIGS. 5A, 5B, 6A, and 6B.

Figure 5A:
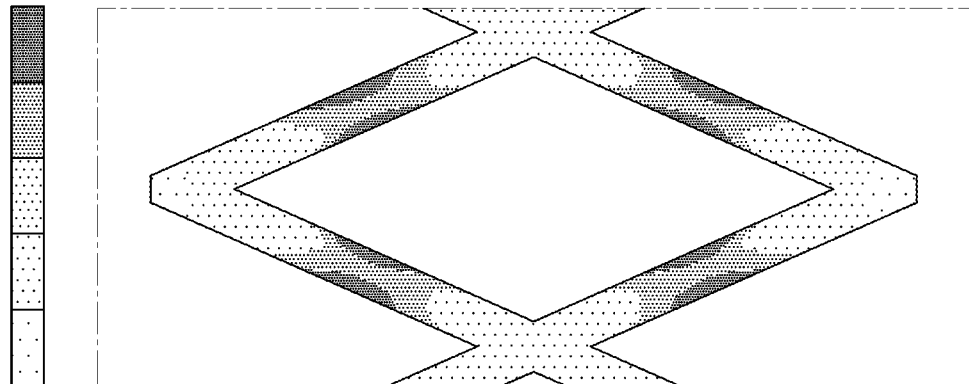
FIG. 5A is a schematic view illustrating a stress which is applied to a wiring line when a bending area of an organic light emitting display device according to Comparative Example is bent.
Figure 5B:
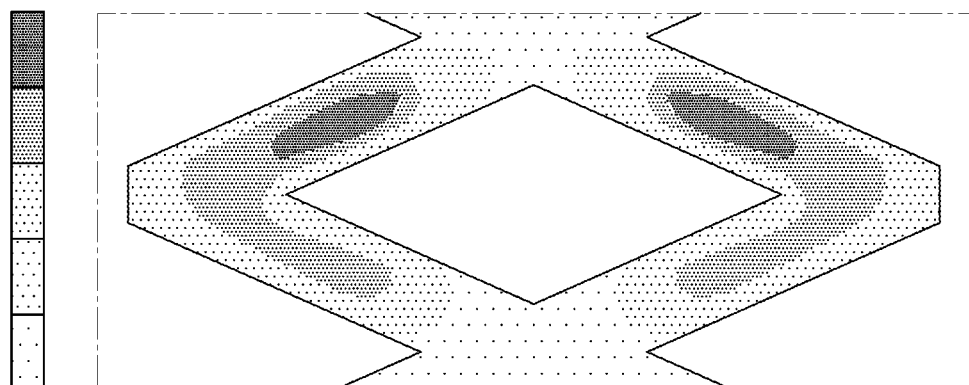
FIG. 5B is a schematic view illustrating a stress which is applied to a protective layer which covers a wiring line when a bending area of an organic light emitting display device according to Comparative Example is bent.
Figure 6A:
FIG. 6A is a schematic view illustrating a stress which is applied to a wiring line when a bending area of an organic light emitting display device according to an aspect of the present disclosure is bent.
Figure 6A:
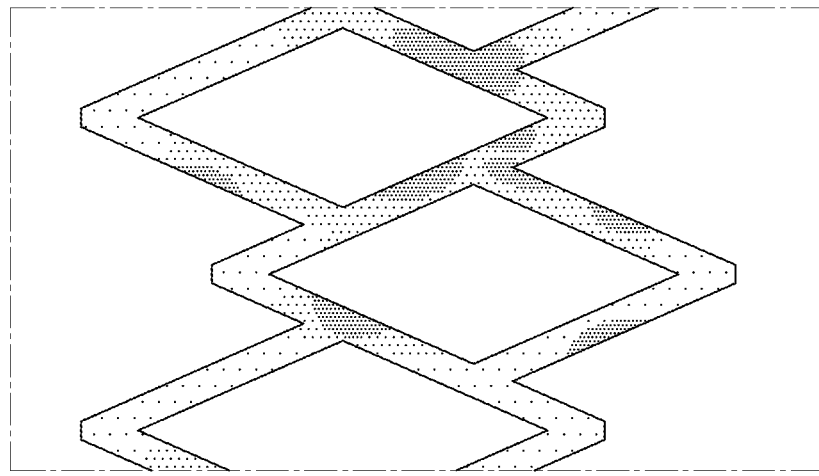
Figure 6B:
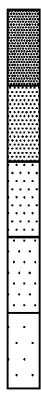
FIG. 6B is a schematic view illustrating a stress which is applied to a protective layer which covers a wiring line when a bending area of an organic light emitting display device according to an aspect of the present disclosure is bent.
Figure 6B:
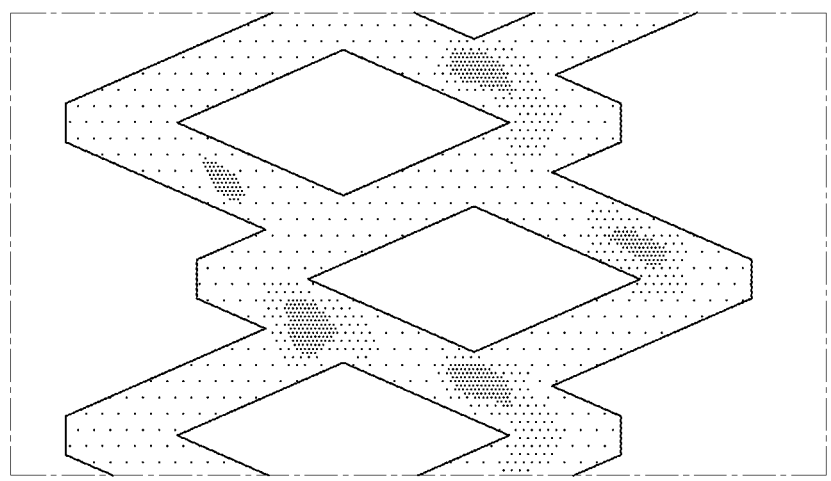

FIG. 5A is a schematic view illustrating a stress which is applied to a wiring line when a bending area of an organic light emitting display device according to Comparative Example is bent. FIG. 5B is a schematic view illustrating a stress which is applied to a protective layer which covers a wiring line when a bending area of an organic light emitting display device according to Comparative Example is bent. FIG. 6A is a schematic view illustrating a stress which is applied to a wiring line when a bending area of an organic light emitting display device according to Example of the present disclosure is bent. FIG. 6B is a schematic view illustrating a stress which is applied to a protective layer which covers a wiring line when a bending area of an organic light emitting display device according to Example of the present disclosure is bent. In FIGS. 5A, 5B, 6A, and 6B, the larger the density of the points, the greater the stress applied to the area.

Referring to FIGS. 5A and 6A, it is confirmed that as compared with the wiring line of Example 1, in the wiring line of Comparative Example 1, there is an area where a great stress is partially applied. Similarly, referring to FIGS. 5B and 6B, as compared with the protective layer of Example 1, a strong stress is entirely applied to the protective layer of Comparative Example 1 at the time of bending. In this case, the maximum stress among stresses illustrated in FIGS. 5A, 5B, 6A, and 6B is represented in the following Table 1.

TABLE 1

| Classification | Example 1 | Comp. Ex. 1 |
| --- | --- | --- |
| Maximum stress of wiring line | 14.3 MPa | 21.0 MPa |
| Maximum stress of protective layer | 1886.3 MPa | 2717.8 MPa |

As seen from Table 1, the wiring line structure of Example 1 which has a plurality of rhombic unit patterns and has a structure in which each of the plurality of unit patterns shares a part of one side with an adjacent unit pattern. Therefore, it is confirmed that a wiring line structure of Example 1 in which joints are connected to three sub wiring lines has a reduced stress as compared with the wiring line structure of Comparative Example 1 which has a plurality of rhombic unit patterns and in which joints are connected to four sub wiring lines. For example, a stress which is applied to the wiring line is reduced by 30% of the maximum stress. Similarly, a stress which is applied to the protective layer is reduced by 30% of the maximum stress.

Figure 7A:
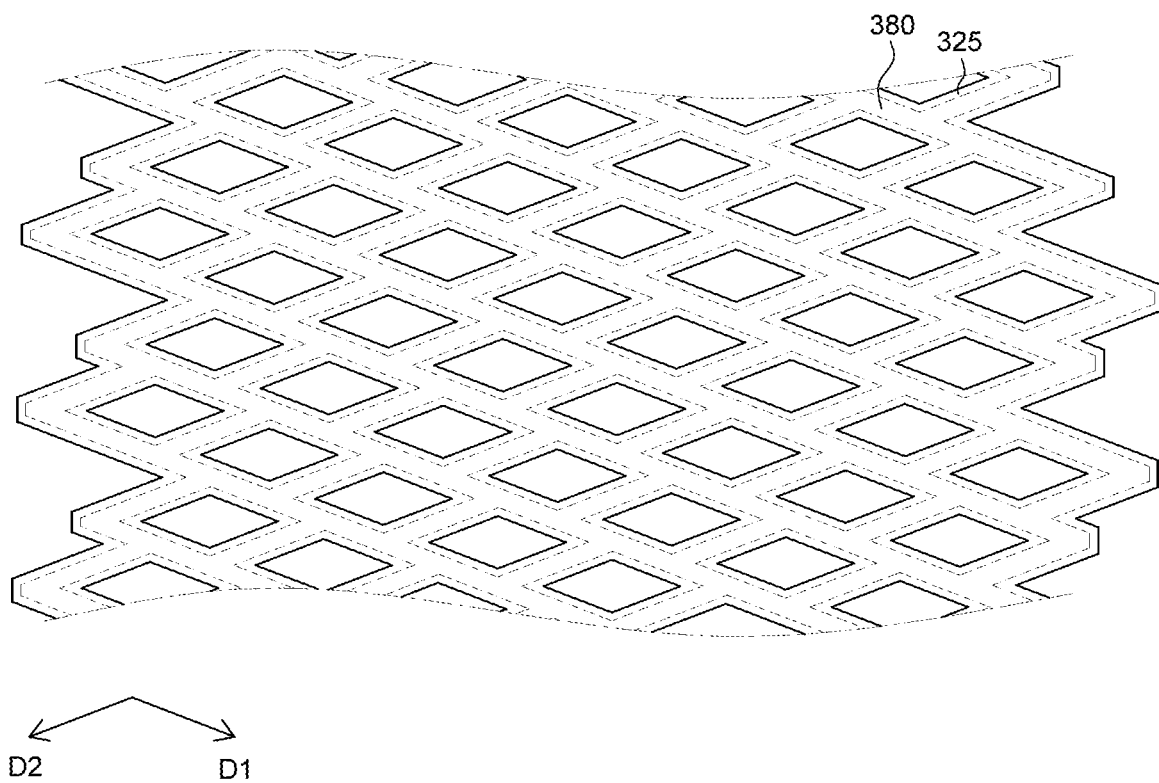
FIGS. 7A and 7B are schematic enlarged plan views illustrating a wiring line of an organic light emitting display device according to another exemplary aspect of the present disclosure.
Figure 7B:
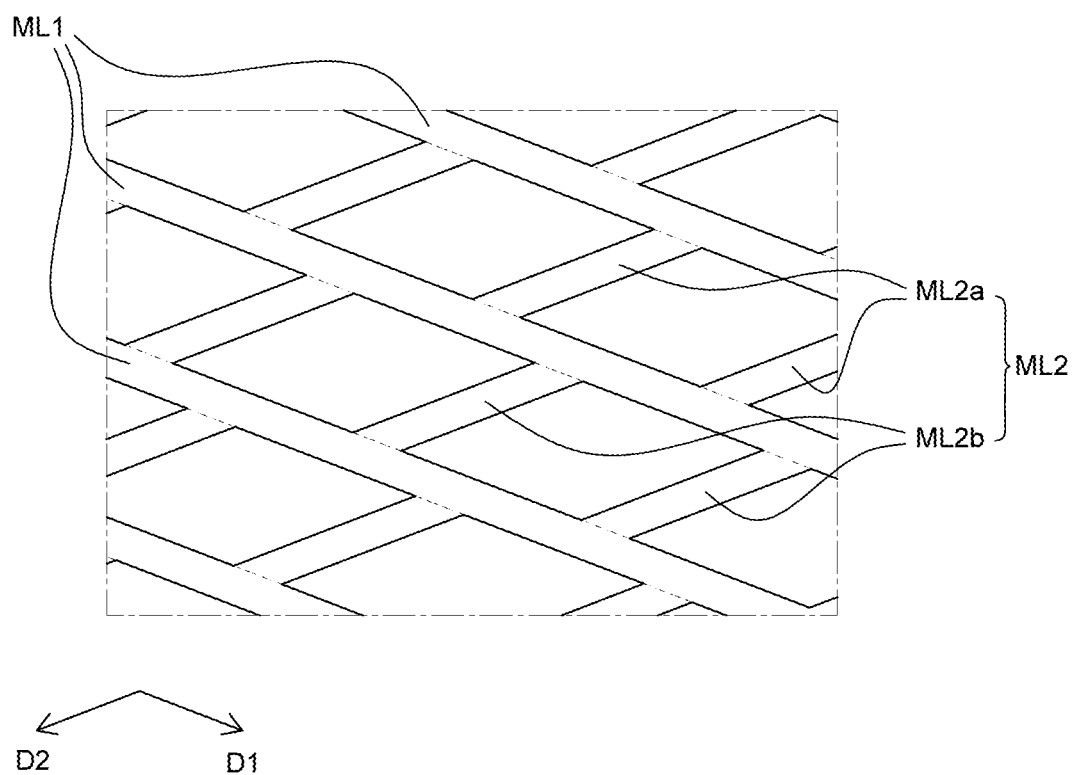

FIGS. 7A and 7B are plan views for explaining a shape of a wiring line of an organic light emitting display device according to another exemplary aspect of the present disclosure. Specifically, FIG. 7A is an enlarged schematic plan view illustrating a wiring line 380 and a protective layer 325 disposed on a flexible substrate of an organic light emitting display device according to another exemplary aspect of the present disclosure. In FIG. 7A, the wiring line is represented by a dotted line and the protective layer disposed on the wiring line is represented by a solid line. FIG. 7B is an enlarged schematic plan view illustrating only the wiring line with a solid line by enlarging a partial area of FIG. 7A.

The wiring line 380 illustrated in FIGS. 7A and 7B have a structure in which a plurality of rhombic unit patterns is continuously disposed vertically and horizontally, like a grid shape. In this case, the plurality of rhombic unit patterns shares a part of one side with an adjacent unit pattern. In the wiring line 180 illustrated in FIG. 3A, the rhombic openings formed by the plurality of unit patterns are arranged in a zigzag. In contrast, in the wiring line 380 illustrated in FIGS. 7A and 7B, rhombic openings formed by the plurality of unit patterns are arranged in the form of a net.

More specifically, referring to FIG. 7B, the wiring line 380 illustrated in FIGS. 7A and 7B includes a plurality of first wiring lines ML1 extending in a first direction D1 and a plurality of second wiring lines ML2 which extends to a second direction D2 which is different from the first direction D1. The plurality of second wiring lines ML2 electrically connects two adjacent first wiring lines ML1 among the plurality of first wiring lines. The first wiring lines ML1 are wiring lines which are arranged long in the first direction D1. The plurality of second wiring lines ML2 may have a pattern shape disposed between the first wiring lines ML1 in the second direction D2 so that the adjacent first wiring lines ML1 are connected to each other. In this case, the wiring line 380 illustrated in FIGS. 7A and 7B may form a rhombic opening by two adjacent first wiring lines ML1 and two second wiring lines ML2 which are disposed between two adjacent first wiring lines ML1.

In this case, a second wiring line ML2a which is connected to one side with respect to one first wiring line ML1 and a second wiring line ML2b which is connected to the other side are alternately arranged. That is, a joint where the second wiring line ML2a which is connected to a right side with respect to the first wiring line ML1 and the first wiring line meet does not overlap a joint where the second wiring line ML2b which is connected to a left side and the first wiring line meet. That is, the second wiring line ML2a connected to the right side of the plurality of the first wiring lines ML1 and the second wiring line ML2b connected to the left side are arranged in a zigzag pattern.

In this case, a part of the second wiring line ML2 is connected to an end of at least one first wiring line ML1 to form a left end or a right end of the wiring line 380 with respect to the bending direction. In this case, the joint where the second wiring line ML2 and the first wiring line ML1 meet may be a structure formed from two wiring lines.

Similar to the wiring line 180 illustrated in FIGS. 3A and 3B, the wiring line 380 illustrated in FIGS. 7A and 7B has a common characteristic in that a plurality of unit patterns having a rhombic shape is provided and a unit pattern and an adjacent unit pattern share a part of one side. Therefore, as compared with a structure in which four wiring lines meet at one joint, a stress applied to the joint when the metal is bent is reduced.

The wiring line 380 illustrated in FIGS. 7A and 7B may be easily used when a low electrical resistance is required or a high voltage is applied. For example, in the organic light emitting display device, the wiring line 380 illustrated in FIGS. 7A and 7B may be used as a VSS wiring line or a VDD wiring line.

In the meantime, in the wiring line structure illustrated in FIGS. 7A and 7B, shapes of the wiring line and the opening are not limited by the example illustrated in FIGS. 7A and 7B.

The exemplary aspects of the present disclosure can also be described as follows:

According to an aspect of the present disclosure, an organic light emitting display device includes a flexible substrate which includes a first area, a second area, and a bending area between the first area and the second area and a wiring line on the bending area of the flexile substrate in which the wiring line includes a plurality of unit patterns having a rhombic shape and each of the plurality of unit patterns shares a part of one side with an adjacent unit pattern.

The plurality of unit patterns may be arranged in a zigzag along a bending direction.

The wiring line may include a first pattern in which the plurality of unit patterns is spaced apart from each other along a bending direction and a second pattern in which the plurality of unit patterns is spaced apart from each other along the bending direction, and a first line which passes a center point of the plurality of unit patterns with the first pattern may be spaced apart from a second line which passes a center point of the plurality of unit patterns with the second pattern.

A distance spaced between the first line and the second line may be shorter than a distance spaced between an outermost edge of the first pattern and the first line and a distance spaced between an outermost edge of the second pattern and the second line.

Each of the plurality of unit patterns may include a first sub wiring line, a second sub wiring line which faces the first sub wiring line, a third sub wiring line which forms an acute angle with the first sub wiring line and forms an obtuse angle with the second sub wiring line, and a fourth sub wiring line which faces the third sub wiring line. Two sub wiring lines among the first sub wiring line, the second sub wiring line, the third sub wiring line, and the fourth sub wiring line of each of the plurality of unit patterns may be shared with another adjacent unit pattern.

A length of an intersecting line at which sub wiring lines of two adjacent unit patterns among the plurality of unit patterns meet may be shorter than a length of the sub wiring line of the unit pattern.

The wiring line may be horizontally asymmetric with respect to the bending direction.

According to another aspect of the present disclosure, an organic light emitting display device includes a flexible substrate which includes a display area in which an organic light emitting element is disposed, a first non-display area enclosing the display area, a bending area extending from the first non-display area, and a second non-display area extending from one side of the bending area and a wiring line disposed in the bending area of the flexile substrate in which one outer edge of the wiring line includes a first protruding portion and a second protruding portion which protrudes more than the first protruding portion, another outer edge of the wiring line includes a third protruding portion corresponding to the second protruding portion and a four protruding portion which protrudes more than the third protruding portion and corresponds to the first protruding portion, and a plurality of openings is arranged in a zigzag in the wiring line.

Each of the plurality of openings may have a rhombic shape and the wiring line may include a connection line which connects between the first protruding portion and the third protruding portion so as to define the plurality of openings.

The wiring line may be a data line or a gate line.

According to yet another aspect of the present disclosure, an organic light emitting display device includes: a flexible substrate which includes a first area, a second area, and a bending area between the first area and the second area and a wiring line on the bending area of the flexile substrate in which the wiring line includes a plurality of first wiring lines extending in a first direction and a plurality of second wiring line which extends in a second direction and connects two adjacent first wiring lines among the plurality of first wiring lines, the plurality of second wiring lines is disposed to be spaced apart from each other along the first direction, and a second wiring line which is connected to one side of the plurality of first wiring lines and a second wiring line which is connected to another side are alternately disposed.

A second wiring line which is connected to one side of each of the plurality of first wiring lines and a second wiring line connected to another side may be disposed in a zigzag.

The first wiring line and the second wiring line may form a plurality of rhombic patterns and joints formed by the plurality of first wiring lines and the plurality of second wiring lines may be intersection points of the wiring lines extended from three different directions.

A part of the plurality of second wiring lines may be in contact with an end of the first wiring line.

The wiring line may be a VDD line or a VSS line.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical spirit of the present disclosure. The scope of the technical spirit of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
   a flexible substrate including a first area, a second area, and a bending area between the first area and the second area; and
   a wiring line on the bending area of the flexile substrate, wherein the wiring line includes a plurality of unit patterns having a rhombic shape and each of the plurality of unit patterns shares less than a full length of one side with an adjacent unit pattern.

2. The organic light emitting display device according to claim 1, wherein the plurality of unit patterns are arranged in a zigzag pattern along a bending direction.

3. The organic light emitting display device according to claim 1, wherein the wiring line includes:
   a first pattern in which the plurality of unit patterns is spaced apart from each other along a bending direction;
   a second pattern in which the plurality of unit patterns is spaced apart from each other along the bending direction;
   a first line passing a center point of the plurality of unit patterns of the first pattern; and
   a second line passing a center point of the plurality of unit patterns of the second pattern, wherein the first and second lines are spaced apart from each other.

4. The organic light emitting display device according to claim 3, wherein a distance between the first line and the second line is shorter than a distance between an outermost edge of the first pattern and the first line and a distance between an outermost edge of the second pattern and the second line.

5. The organic light emitting display device according to claim 1, wherein each of the plurality of unit patterns includes:
   a first sub wiring line;
   a second sub wiring line which faces the first sub wiring line;
   a third sub wiring line which forms an acute angle with the first sub wiring line and forms an obtuse angle with the second sub wiring line; and
   a fourth sub wiring line which faces the third sub wiring line, wherein two sub wiring lines of the first sub wiring line, the second sub wiring line, the third sub wiring line, and the fourth sub wiring line of each of the plurality of unit patterns are shared with another adjacent unit pattern.

6. The organic light emitting display device according to claim 5, wherein the two sub wiring lines of two adjacent unit patterns among the plurality of unit patterns have an overlapping portion shorter than a length of the sub wiring line of the unit pattern.

7. The organic light emitting display device according to claim 1, wherein the wiring line is horizontally asymmetric with respect to a bending direction.

8. An organic light emitting display device, comprising:
   a flexible substrate including a first area, a second area, and a bending area between the first area and the second area; and
   a wiring line on the bending area of the flexile substrate, including first, second and third unit patterns, and having a rhombic shape,
   wherein the first, second and third unit patterns share less than a full length of one side with adjacent unit patterns and form four joints spreading out external pressure when the organic light emitting display device is in a bending state.

9. The organic light emitting display device according to claim 8, wherein the first, second and third unit patterns are arranged in a zigzag pattern along a bending direction.

10. The organic light emitting display device according to claim 8, wherein each of the first, second and third unit patterns includes:
    a first sub wiring line;
    a second sub wiring line which faces the first sub wiring line;
    a third sub wiring line which forms an acute angle with the first sub wiring line and forms an obtuse angle with the second sub wiring line; and
    a fourth sub wiring line which faces the third sub wiring line,
    wherein two sub wiring lines of the first sub wiring line, the second sub wiring line, the third sub wiring line, and the fourth sub wiring line of each of the plurality of unit patterns are shared with another adjacent unit pattern.

11. The organic light emitting display device according to claim 10, wherein the two sub wiring lines of two adjacent unit patterns among the plurality of unit patterns have an overlapping portion shorter than a length of the sub wiring line of the unit pattern.

12. The organic light emitting display device according to claim 8, wherein the wiring line is horizontally asymmetric with respect to a bending direction.

* * * * *